United States Patent [19]

Tamura et al.

[11] Patent Number: 4,687,930

[45] Date of Patent: Aug. 18, 1987

[54] ION BEAM APPARATUS

[75] Inventors: Hifumi Tamura, Tokyo; Shigehiko Yamamoto, Saitama; Hiroyasu Shichi, Tokyo; Toru Ishitani, Saitama, all of Japan

[73] Assignee: Hitachi, Ltd., Tokyo, Japan

[21] Appl. No.: 736,123

[22] Filed: May 20, 1985

[30] Foreign Application Priority Data

May 18, 1984 [JP] Japan .................................. 59-98724

[51] Int. Cl.⁴ ........................................... G01N 23/00
[52] U.S. Cl. ..................................... 250/309; 250/306
[58] Field of Search ...................... 250/309, 306, 492.2

[56] References Cited

U.S. PATENT DOCUMENTS 3,930,155  12/1975  Kanomata et al. ................ 250/309

Primary Examiner—Bruce C. Anderson
Attorney, Agent, or Firm—Antonelli, Terry & Wands

[57] ABSTRACT

The surface of a specimen such as a semiconductor wafer is processed and analyzed by the irradiator of the surface with an ion beam. The zone of the specimen to be processed and analyzed is kept by heating at a temperature higher than the melting point of an element or compound forming the ion species used for the irradiation. The means used for this heating may be an electron beam source, a light source, a resistance heating source, or a high-frequency heating source.

6 Claims, 4 Drawing Figures

ION BEAM APPARATUS

BACKGROUND OF THE INVENTION

This invention relates to an ion beam apparatus for irradiating a specimen with an ion beam thereby effecting processing such as cutting a groove, etc. in the surface of the specimen by utilizing the ion beam, and analysis on the specimen, and more particularly to an ion beam apparatus suitable for microprocessing and microanalysis of such specimens as semiconductor wafers.

In the conventional apparatus for effecting microprocessing and microanalysis on a given specimen by the use of an ion microbeam as described in Japanese Patent Application Laid-open No. SHO 52(1977)-142,580, the specimen under treatment is kept at a temperature below the melting point of the raw material for the aforementioned ion beam. When the ion beam generated with a metallic element or compound is projected on the given specimen in a cumulative amount exceeding a certain level under the condition described above, the primary ion species adheres unevenly on the surface of the specimen and moves around on the surface. This phenomenon entails the following problems.

(1) The deposit on the rear surface of the specimen plays the part of a mask during the processing and analysis and brings about a critical adverse effect upon the two operations.

(2) The deposit causes pollution of the specimen and induces degradation of the properties of the production of processing.

SUMMARY OF THE INVENTION

An object of the present invention is to provide an ion beam apparatus which, by the irradiation of the surface of a given specimen with an ion beam, enables the specimen to be microprocessed and microanalyzed with high accuracy without entailing any deposition of the primary ion species on the surface of the specimen.

This invention has been perfected with a view to accomplishing the object described above by providing an ion beam apparatus characterized by being provided with a heating means capable of keeping the temperature of a given specimen at least above the melting point of an element or compound forming the ion beam.

DETAILED DESCRIPTION OF THE PREFERRED EMBODIMENT

The phenomenon that during the irradiation of the surface of a given specimen with an ion beam, the primary ion species adheres to the surface of the specimen occurs because the temperature of the specimen is lower than the melting point of the primary ion species. The present invention successfully precludes the deposition of the primary ion species by keeping the temperature of the surface of the specimen above the melting point of the primary ion species. It accomplishes the desire to enhance the efficiency of processing and the sensitivity of analysis by the introduction of an activated gas to the neighborhood of the specimen.

Figure 1:
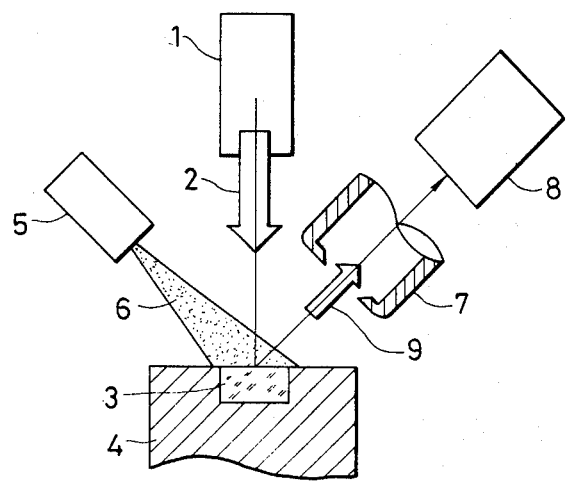
FIG. 1 is a schematic diagram illustrating an ion beam apparatus as a first embodiment of the present invention, specifically an ion microanalyzer using an electron beam as a heating means.

Now, a first embodiment of the present invention will be described below with reference to FIG. 1. This diagram depicts the outcome of application of the present invention to an ion microanalyzer. In FIG. 1, 1 denotes a primary ion beam radiation system provided with a Cs liquid metal ion source, 2 a $Cs^+$ beam, 3 a specimen, 4 a specimen stand, 5 a heating means using an electron beam as heat source, 6 an electron beam, 7 a secondary charged particle extraction electrode, 8 a mass spectrometer, and 9 a secondary ion beam.

The ion microanalyzer functions on the following operating principle. First, the specimen 3 is heated to and kept at a temperature higher than the melting point of the primary ion species by the heating means 5. In this case, since the melting point of Cs is about 30° C., the specimen 3 is to be heated to a temperature not lower than this melting point. Then, the ion beam 2 is caused to impinge on the surface of the specimen 3 and effect required processing and analysis of the specimen 3. An activated gas is introduced when necessary for the purpose of enhancing the efficiency of processing and the sensitivity of analysis. The activated gas used for this purpose is desired to be $O_2$. However, $N_2$, $Cl_2$, $F_2$ and compounds thereof and of $O_2$ may be used.

Now, a specimen was analyzed and evaluated by applying the present invention to IMA. The results are shown below. The specimen was a piece of GaAs. The analysis and evaluation was carried out under the conditions shown in Table 1.

TABLE 1

| | |
|---|---|
| Primary ion species | $Cs^+$ |
| Primary ion energy | 15 keV |
| Primary ion current | 1 μA |
| Specimen heating means | Device for heating with electron beam |
| Temperature of specimen heating | 45° C. |
| Gas to be introduced | $O_2$ ar none |

Figure 2:
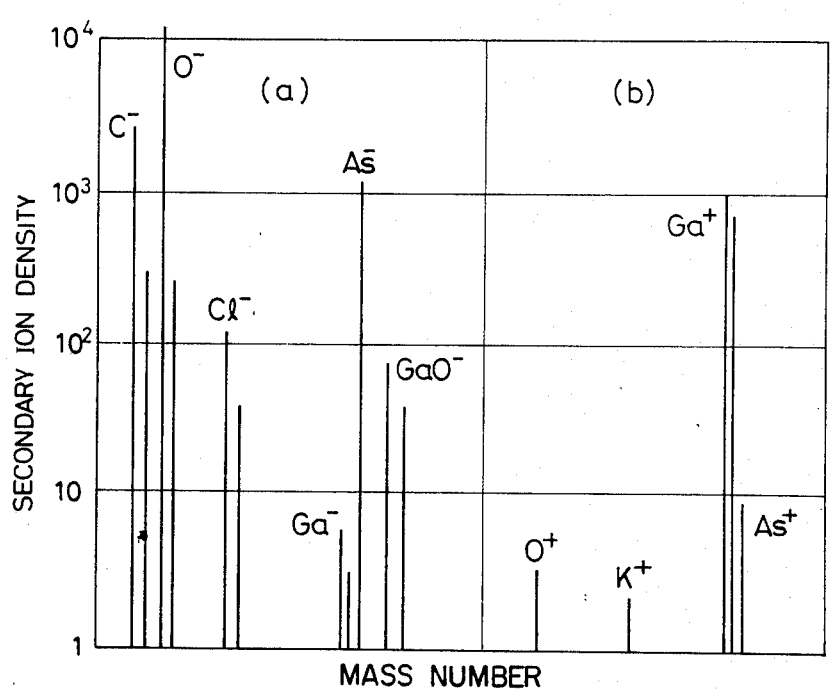
FIG. 2 is a diagram showing a typical mass spectrum of GaAs obtained with an ion microanalyzer embodying the present invention.

FIG. 2 shows the mass spectra of GaAs measured under two conditions, i.e. (a) the condition using $Cs^+$ as the primary ion, omitting the introduction of $O_2$, and keeping the temperature of the specimen at room temperature (<25° C.) and (b) the condition using the same primary ion, introducing $O_2$ gas into the specimen chamber, and keeping the temperature of the specimen at 45° C.

In the case of the condition (a), it is noted that negative secondary ion yields for such elements as $C^-$, $Cl^-$, $O^-$, and $As^-$ which have high degrees of electronegativity are high, whereas ion yields for electropositive elements are extremely low. In the case of the condition (b), it is noted that the adsorption of Cs as the primary ion species on the surface of the specimen was avoided, the effect of the introduced gas $O_2$ was emphasized, and the ion yields of the positive elements were notably improved. It is clear that under the condition (b), the ion yield of Ga+ was very high as compared with that of As+.

Irradiation with a primary ion was carried out under the condition using In+ as the primary ion and fixing the primary ion energy at 20 eV, the beam diameter on the specimen at 0.3 μm, and the ion current at $10^{-10}$ A. The temperature of the specimen was kept at 300° C. by the heating with an electron beam. Processing was effected by cutting a groove in the specimen by causing the primary ion beam to make a linear deflection scanning of the specimen. The beam scanning was repeated several times until an average dosage reached $10^{18}/cm^2$. Consequently, it was found that a groove 0.4 μm in width and 0.5 μm in depth was formed accurately in the specimen. Further, as the effect of this invention, it was shown by analysis that on the surface of the processed specimen, the primary ion species of In was not deposited at all.

When the specimen 3 is heated with the electron beam as illustrated in FIG. 1, the specimen 3 can be exclusively heated. Moreover, this heating is effected exclusively on the surface of the specimen 3.

Figure 3:
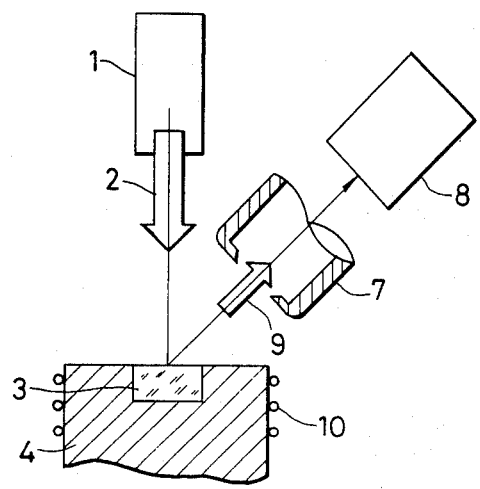
FIG. 3 is a schematic diagram illustrating an ion beam apparatus as a second embodiment of the present invention, specifically an ion microanalyzer using resistance heating as a heating means.

Now, a second embodiment of the present invention will be described below with reference to FIG. 3. The microanalyzer shown in FIG. 3 differs from that shown in FIG. 1 only with respect to the means used for heating the specimen.

In the present embodiment, the specimen 3 is heated in conjunction with the specimen stand 4 by utilizing the resistance heating generated with a conductor possessing resistance.

Figure 4:
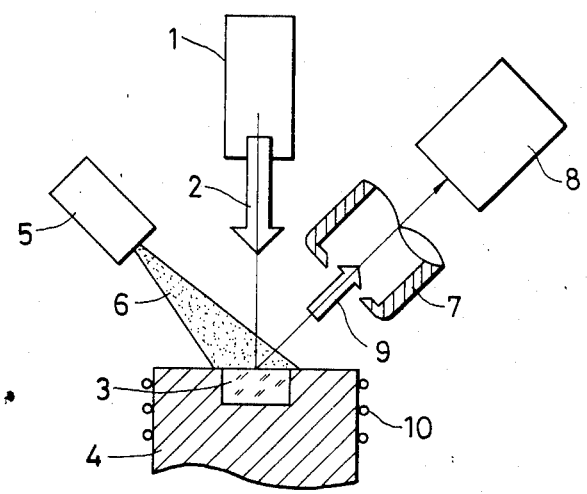
FIG. 4 is an ion beam apparatus as a third embodiment of the present invention, specifically an ion microanalyzer jointly using an electron beam and resistance heating as heating means.

In a third embodiment illustrated in FIG. 4, an electron beam source 5 and a conductor line 10 are both used as means for heating the specimen 3.

Where the raw material for the primary ion has a relatively low melting point, a light source such as for an infrared ray can be used in the place of the electron beam source 5 in FIG. 1. Optionally, high-frequency heating may be utilized in the place of the resistance heating illustrated in FIG. 3.

It has been demonstrated that the following effects are derived from the present invention.

(1) Deposition of the primary ion species on the surface of the specimen is precluded and the accuracy of processing and analysis is improved.

(2) The heating of the specimen and the introduction of an activated gas notably improve the speed of processing and the sensitivity of analysis.

(3) By utilizing an electropositive element like Cs or Ba as the primary ion species for IMA and optionally adopting the heating of a specimen and the introduction of an activated gas, the sensitivity of analysis is improved with respect to virtually all elements (both electronegative and electropositive elements) with one fixed ion source.

What is claimed is:

1. An ion beam apparatus for at least one of processing and analyzing a specimen comprising, ion beam generating means for generating an ion beam and for irradiating the specimen with the ion beam, and means for heating the specimen to at least a predetermined temperature above the melting point of one of an element and compound forming the ion beam, whereby the heating of the specimen to at least the predetermined temperature enables prevention of a deposition of an ion species of the ion beam on a surface of the specimen and enables high accuracy of at least one of processing and analysis of the specimen.

2. An ion beam apparatus according to claim 1, wherein the heating means includes an electron beam source for irradiating the specimen so as to heat the specimen.

3. An ion beam apparatus according to claim 1, wherein the heating means includes a resistance heating means for heating the specimen.

4. An ion beam apparatus according to claim 1, further comprising means for introducing an activated gas into the region of the specimen.

5. An ion beam apparatus according to claim 1, wherein the ion beam generating means generates a beam of any one ion selected from the group consisting of Ga+, Cs+, and Ba+ as the ion beam, and further comprising means for introducing a gas into the region of the specimen, the gas introducing means introducing any one gas selected from the group consisting of $O_2$, $N_2$, $Cl_2$, $F_2$, and compounds thereof as the one gas.

6. An ion beam apparatus according to claim 1, further comprising analyzing means for analyzing at least the secondary ions emitted from the specimen.

* * * * *